United States Patent
Hierholzer

(10) Patent No.: US 6,809,411 B2
(45) Date of Patent: Oct. 26, 2004

(54) LOW-INDUCTANCE SEMICONDUCTOR COMPONENTS

(75) Inventor: Martin Hierholzer, Moehnesee (DE)

(73) Assignee: EUPEC Europaeische Gesellschaft fuer Leitungshalbleiter mbH, Warstein-Belecke (DE)

( * ) Notice: Subject to any disclaimer, the term of this patent is extended or adjusted under 35 U.S.C. 154(b) by 278 days.

(21) Appl. No.: 10/023,189

(22) Filed: Dec. 17, 2001

(65) Prior Publication Data

US 2002/0089046 A1 Jul. 11, 2002

Related U.S. Application Data

(63) Continuation of application No. PCT/DE00/01254, filed on Apr. 20, 2000.

(30) Foreign Application Priority Data

Jun. 15, 1999 (DE) .......................................... 199 27 285

(51) Int. Cl.[7] ....................... H01L 23/495; H01L 23/48; H05K 7/00; H05K 7/20; H05K 5/00
(52) U.S. Cl. ....................... 257/678; 257/666; 257/713; 257/690; 257/692; 361/715; 361/679; 361/702; 361/720; 361/730; 361/736
(58) Field of Search ................................ 257/466, 713, 257/678, 690, 691, 692; 361/715, 679, 702, 720, 730, 736

(56) References Cited

U.S. PATENT DOCUMENTS

| 4,038,488 | A | * | 7/1977 | Lin .............................. 174/52.4 |
| 4,809,135 | A | * | 2/1989 | Yerman ....................... 361/772 |
| 5,089,877 | A | * | 2/1992 | Queyssac et al. ........... 257/666 |
| 5,617,293 | A | | 4/1997 | Schulze et al. |
| 5,629,559 | A | * | 5/1997 | Miyahara .................... 257/666 |

FOREIGN PATENT DOCUMENTS

| DE | 196 45 636 C1 | 3/1998 |
| EP | 0 558 226 A2 | 9/1993 |

* cited by examiner

Primary Examiner—David L. Talbott
Assistant Examiner—James Mitchell
(74) Attorney, Agent, or Firm—Laurence A. Greenberg; Werner H. Stemer; Gregory L. Mayback

(57) ABSTRACT

In order to obtain a minimal leakage inductance in a semiconductor component, it is necessary to provide at least two adjacent switching elements whose load current connection elements which are adjacent on one housing side to have different polarities. A multiplicity of even-numbered switching elements are advantageously disposed next to one another on an alignment line. The leads between the load current connection elements and the load current connections of the switching elements that are disposed next to one another advantageously run approximately orthogonally with respect to the alignment line. The assigned load current connection elements then alternately have the first and the second supply potential and this minimizes the leakage inductance.

6 Claims, 1 Drawing Sheet

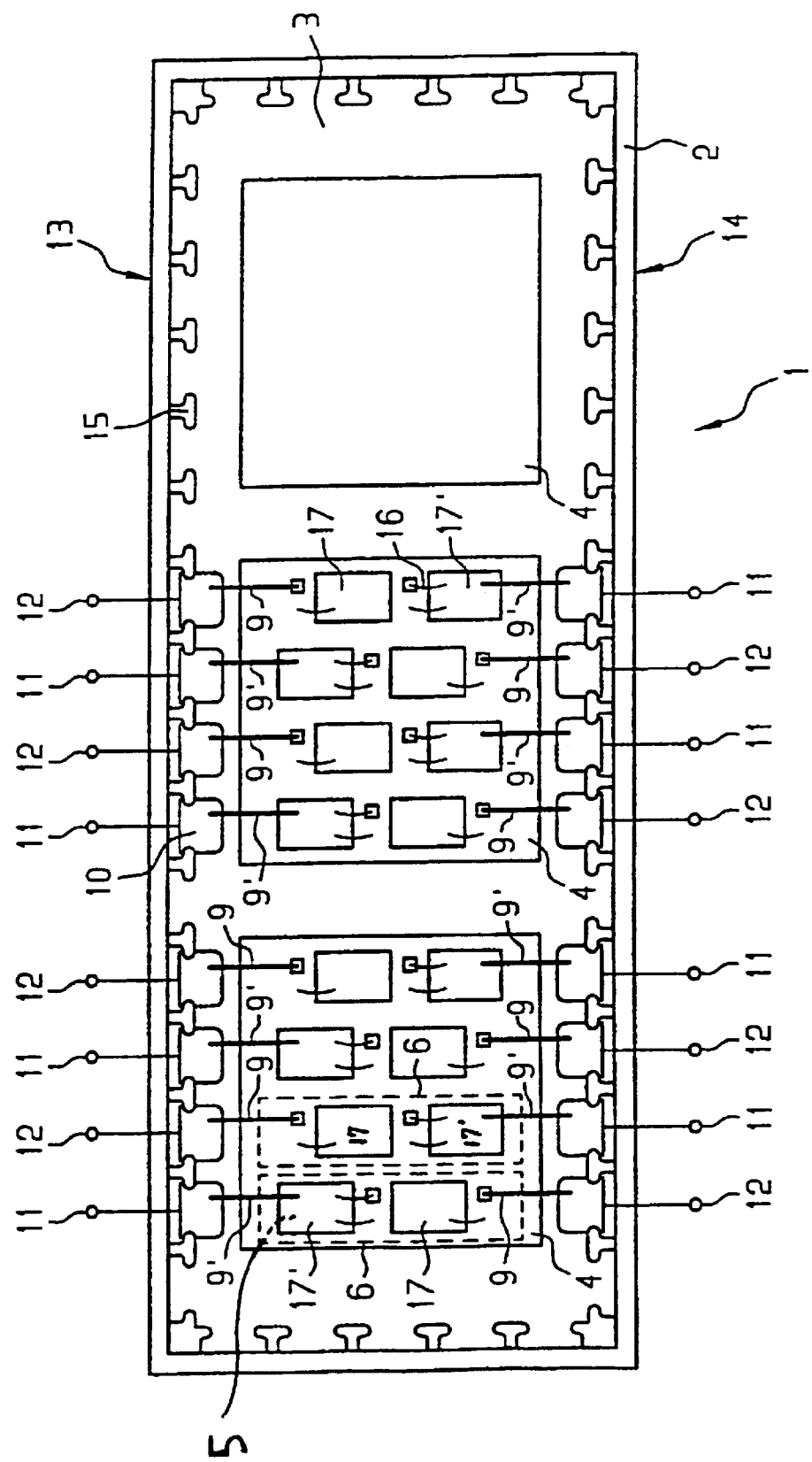

LOW-INDUCTANCE SEMICONDUCTOR COMPONENTS

CROSS-REFERENCE TO RELATED APPLICATION

This application is a continuation of copending International Application PCT/DE00/01254, filed Apr. 20, 2000, which designated the United States.

BACKGROUND OF THE INVENTION

Field of the Invention

The invention relates to a semiconductor component having a housing, a carrier plate, and at least one ceramic substrate, which is provided with a metalization layer at least at its top side. Furthermore, the semiconductor component has at least two switching elements, which are disposed in an electrically conductive manner on the top side of the ceramic substrate and each have load current connections and a control connection. Moreover, provision is made of load current connection elements on a first side and a second side, opposite to the first side, which are electrically connected to the load current connections of the switching elements via leads. In this case, the load current connection elements may have a first or a second supply potential.

Semiconductor components of this type are used for example in motor vehicles between at least one battery-backed low-voltage on-board electrical system, and a starter-generator as a starter or a charging device for the respective battery. They serve, during overrun operation of the motor vehicle, for adapting voltage and power of the starter-generator, which then operates as a generator, to the corresponding operating data of the respective battery to be recharged and, during starting of the starter-generator, which then operates as a motor, with the aid of the respective battery, for ensuring a sufficient starting torque with a correspondingly high starting current.

Essential structural parts of such a circuit configuration are held to be, in particular, a number of semiconductor half-bridges as power structural parts, a number of intermediate circuit components, in particular capacitors, and a number of control elements, in particular driver stages. A semiconductor component of this type is disclosed in German Patent DE 196 45 636 C1, for example, which component serves for driving an electric motor.

The semiconductor components described often have MOSFETs as the switching elements. MOSFETs are turned on and off by a control voltage applied between a source contact and a gate contact. In practice, the control voltage is applied between the source connection and the gate connection. The wire leading to the source contact has an inherent inductance which has the effect that the load current which changes with respect to time during the switching-on or switching-off of the MOSFET induces a voltage in the inductance which counteracts the control voltage in a switching-delaying manner. If a plurality of MOSFETs are connected in parallel and driven jointly from a single voltage source, then the aforementioned inductance causes high-frequency oscillations to occur in the drive circuit, owing to unavoidable component tolerances, with amplitudes that can destroy the MOSFET. The oscillation frequency is critically determined by the inductance of the source connection and, in addition, by other parasitic network and component parameters. In order to reduce the disadvantages of the effect of the inductance of the source connection, European Patent EP 0 265 833 B1 proposes disposing the interconnects which are connected to the source connections on one side of the MOSFET and the interconnects for driving on the other side of the MOSFET. This results in extensive magnetic decoupling of the drive circuit from the source connections of the semiconductor component.

Consequently, it is predominantly the leakage inductances in the leads to the load current connections of one or more semiconductor switches which pose problems, i.e. over-voltages, particularly in the case of very high rates of current rise (dI/dt). Large capacitors and resistors are necessary, therefore, in order to compensate for the over-voltages. However, the capacitors and resistors can adversely affect the switching behavior of the semiconductor components. In order to avoid these disadvantages, it is endeavored in practice to reduce the inductances in the leads by skillful, i.e. short, interconnect routing.

SUMMARY OF THE INVENTION

It is accordingly an object of the invention to provide low-inductance semiconductor components that overcome the above-mentioned disadvantages of the prior art devices of this general type, which does not have the disadvantageous effect of the leakage inductances and can be produced in a simple manner.

With the foregoing and other objects in view there is provided, in accordance with the invention, a semiconductor component. The semiconductor component contains a carrier plate, a housing connected to the carrier plate and having a first side and a second side opposite the first side, and at least one ceramic substrate having a top side and a metalization layer disposed at least at the top side. The ceramic substrate is supported by the carrier plate. At least two switching elements are disposed at the top side of the ceramic substrate and each have load current connections and a control connection. The two switching elements are disposed next to one another. A plurality of external load current connection elements are disposed on the first side and the second side of the housing. Leads connect the external load current connection elements electrically to the load current connections of the switching elements. The leads are disposed substantially parallel to each other, and adjacent ones of the external load current connection elements each have an opposite polarity, so that adjacent ones of the leads each carry opposite current directions. First terminals for receiving a first supply potential are connected to some of the external load current connection elements. Second terminals for receiving a second supply potential are connected to others of the external load current connection elements not connected to the first terminals. The two switching elements include a first switching element connected to a first of the external load current connection elements on the first side of the housing and the first external load current connection element is connected to one of the first terminals. The first switching element is further connected to a second of the external load current connection elements on the second side of the housing and the second external load current connection element is connected to one of the second terminals. The two switching elements have a second switching element connected to a third of the external load current connection elements on the second side of the housing and the third external load current connection element is connected to one of the first terminals. The second switching element is further connected to a fourth of the external load current connections on the first side of the housing and the fourth external load current connection element is connected to one of the second terminals.

To put it another way, the leads of two adjacent switching elements are disposed in such a way that magnetic fields produced in the leads are mutually compensated by the opposite polarity at the load current connection elements and the effective inductance is thereby minimized.

It is furthermore provided that a switching element is connected to the two leads, the leads extending between the first and second sides of the housing and one lead having the first supply potential and the other lead having the second supply potential.

It is furthermore provided that the first and, respectively, the second supply potential are applied to the load current connection elements which are situated on one housing side and are assigned to two adjacent switching elements. In order to obtain a minimal leakage inductance, it is consequently necessary to provide at least two adjacent switching elements whose load current connection elements which are adjacent on one housing side have a different polarity. The advantages of the invention can be achieved with any even number of switching elements. The multiplicity of even-numbered switching elements are advantageously disposed next to one another on an alignment line. The leads between the load current connection elements and the load current connections of the switching elements that are disposed next to one another advantageously run approximately orthogonally with respect to the alignment line. The assigned load current connection elements then alternately have the first and the second supply potential. In addition to the low leakage inductance, a very compact construction of the semiconductor component can be achieved as a result of this. Only little area need be provided for suitable interconnect routings or for the leads, which enables a cost-effective construction.

A switching element preferably contains two semiconductor switches which are serially connected to one another and whose junction point is connected to a load current connection element and forms an output of the semiconductor component.

The two serially connected semiconductor switches are preferably disposed on an alignment line that is approximately orthogonal with respect to the first and, respectively, the second side. A half-bridge is thereby formed in a known manner.

It is furthermore conceivable for the multiplicity or part of the multiplicity of switching elements or half-bridges to be connected in parallel by the metalization layer and/or bonding wires in order to increase the current-carrying capacity of the semiconductor component. This enables the use of high power ranges.

MOSFETs or IGBTs are preferably used as the switching elements. However, any desired controllable semiconductor switch can be used, in principle. The invention is preferably used for driving a phase of a 3-phase invertor module. The semiconductor component then constitutes a very low-inductance half-bridge.

Other features which are considered as characteristic for the invention are set forth in the appended claims.

Although the invention is illustrated and described herein as embodied in low-inductance semiconductor components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a diagrammatic, plan view of a semiconductor component according to the invention.

DESCRIPTION OF THE PREFERRED EMBODIMENTS

Referring now to the single FIGURE of the drawing in detail, there is shown a semiconductor component 1 according to the invention in a plan view. The semiconductor component 1 has a housing 2, which is connected to a carrier plate 3. By way of example, three ceramic substrates 4 are applied on the carrier plate 3, the substrates 4 are disposed toward the housing interior. Just a single ceramic substrate 4 could also be used. Each of the ceramic substrates 4 is provided with a metallization layer 5, on which an even number of switching elements 6 are applied. In the figure, the left-hand and middle ceramic substrates 4 each have four switching elements 6. Each switching element 6 contains two semiconductor switches 17, 17'. The latter are disposed on an alignment line, which are disposed approximately orthogonally with respect to two long sides 13, 14 of the housing 2. The semiconductor switch 17, 17' may be embodied e.g. as a MOSFET or as an IGBT.

Each of the two semiconductor switches 17, 17' is connected to the metalization layer 5 via bonding wires 16. Furthermore, each semiconductor switch 17, 17' is connected to a load current connection element 10 via a lead 9. The lead 9 may be embodied for example as a bonding wire or, alternatively, as a single wire. The lead 9 is disposed approximately in the alignment line of the two semiconductor switches 17, 17'. In the present figure, the load current connection elements 10 are fixed in so called guide elements 15 on the inside of the housing 2. This mechanical embodiment represents only a variant as to how the switching elements 6 can be contact-connected toward the outside via the leads 9. It goes without saying that any other variant is conceivable. The very top left load current connection element 10 is connected to a first supply potential 11, which might be e.g. the ground potential. In contrast, a second supply potential 12 is applied to the load current connection element 10 adjacent thereto on the right. The load current connection element is assigned to the second switching element 6. As indicated in the figure, the first supply potential 11 and the second supply potential 12 are alternately applied to the load current connection elements 10 on the first side 13 of the housing 2 (from left to right). On the second side 14, the second supply potential 12 and then the first supply potential 11 are alternately applied to the load current connection elements 10 (from left to right). Compared with the prior art, the inductance can be reduced from 50 nH to 5 nH with the semiconductor component 1 according to the invention.

It is assumed by way of example below that the semiconductor switches 17, 17' are MOSFETs. A source contact of the MOSFET 17, 17' is disposed on the top side, while a drain contact is situated on the rear side and is electrically and mechanically linked to the metalization layer 5. The following load current path is then produced in the case of the switching element 6 disposed on the far left, from top to bottom: the first supply potential 11 at the load current connection element 10—the lead 9'—the source of the semiconductor switch 17' (top side of the semiconductor switch 17')—the drain of the semiconductor switch 17' (underside of the semiconductor switch)—the metalization layer 5—the bonding wire 16—the source contact of the semiconductor switch 17 (top side of the semiconductor switch 17)—the drain contact of the semiconductor switch 17 (under side of the semiconductor switch)—the metalization layer 5—the lead 9—the load current connection element 10, connected to the second supply potential 12.

In the case of the switching element 6 adjacent alongside on the right, the current path is produced from top to bottom in exactly the reverse order: the second supply potential 12 at the load current connection element 10—the lead 9—the metallization layer 5—the drain contact of the semiconductor switch 17—the source contact of the semiconductor switch 17—the bonding connection 16, the metallization layer 5—the drain contact of the semiconductor switch 17'—the source contact of the semiconductor switch 17'—the lead 9—the load current connection element 10, connected to the first supply potential 11 (reference-ground potential).

A load current running from bottom to top is then produced in the first-mentioned case, while the load current runs from top to bottom in the second-mentioned case. The magnetic fields produced by the current flow in the leads are compensated by the opposite current direction. The effective inductance is thereby reduced.

In order to increase the current-carrying capacity, it is possible, by use of the metallization layer 5 and/or the bonding connections 16, for the eight switching elements 17, 17' shown in the figure to be connected in parallel with one another. With the use of identical semiconductor switches 17, 17' in all eight switching elements 6, a current of identical magnitude is produced in all the current paths in the case of connection in parallel. This enables ideal compensation of the magnetic field produced. The explicit illustration of the metallization and of the wiring of the outputs of the half-bridge with load current connection elements has been omitted, since these do not form the core part of the invention.

By way of example, for further reduction of overvoltages, capacitors may additionally be disposed on the ceramic substrate 4 disposed on the right in the housing 2. Compared with the prior art, however, these capacitors may be dimensioned such that they are significantly smaller and thus more cost-effective. Equally, it is conceivable to accommodate the driving for the semi-conductor switches 17, 17' on the ceramic substrate 4 disposed on the right. However, the driving could also be situated outside the semiconductor component.

The semiconductor component 1 according to the invention constitutes a half-bridge in the manner described. The use of three structurally identical semiconductor components according to the invention then-enables a three-phase inverter module to be driven. The module can advantageously be used in a motor vehicle and, for example, drive a three-phase motor which replaces both an alternator and a starter. A use is possible both on 12 V and on 42 V on-board electrical systems.

The invention can expediently be used in all applications that have high rates of current rise. By way of example, a use in converter technology would be conceivable.

I claim:

1. A semiconductor component, comprising:
   a carrier plate;
   a housing connected to said carrier plate and having a first side and a second side opposite said first side;
   at least one ceramic substrate having a top side and a metallization layer disposed at least at said top side, said ceramic substrate supported by said carrier plate;
   at least two switching elements disposed at said top side of said ceramic substrate and each having load current connections and a control connection, said two switching elements disposed next to one another;
   a plurality of external load current connection elements disposed on said first side and said second side of said housing;
   leads connecting said external load current connection elements electrically to said load current connections of said switching elements, said leads disposed substantially parallel to each other, and adjacent ones of said external load current connection elements each have an opposite polarity, so that adjacent ones of said leads each carry opposite current directions;
   first terminals for receiving a first supply potential and connected to some of said external load current connection elements;
   second terminals for receiving a second supply potential and connected to others of said external load current connection elements not connected to said first terminals;
   said two switching elements including a first switching element connected to a first of said external load current connection elements on said first side of said housing and said first external load current connection element connected to one of said first terminals, said first switching element further connected to a second of said external load current connection elements on said second side of said housing and said second external load current connection element connected to one of said second terminals; and
   said two switching elements having a second switching element connected to a third of said external load current connection elements on said second side of said housing and said third external load current connection element connected to one of said first terminals, said second switching element further connected to a fourth of said external load current connections on said first side of said housing and said fourth external load current connection element connected to one of said second terminals.

2. The semiconductor component according to claim 1, wherein said two switching elements are two of a plurality of even-numbered switching elements connected to said external load current connection elements on said first side and said second side such that said switching elements alternately have the first supply potential and then the second supply potential.

3. The semiconductor component according to claim 1, wherein each of said two switching elements contain two semiconductor switches connected in series, each of said two semiconductor switches is connected to one of said external load current connection elements and forms an output of the semiconductor component.

4. The semiconductor component according to claim 3, wherein said two semiconductor switches are disposed on an alignment line orthogonal to said first side and, respectively, said second side.

5. The semiconductor component according to claim 1, wherein said switching elements include transistors are selected from the group consisting of IGBTs and MOSFETs.

6. A method for driving a phase of a 3-phase invertor module, which comprises the step of:
   using the semiconductor component recited in claim 1 for driving the 3-phase invertor module.

* * * * *